United States Patent
Zur (10) Patent No.: US 11,887,810 B2
(45) Date of Patent: Jan. 30, 2024

(54) REDUCED CHARGING BY LOW NEGATIVE VOLTAGE IN FIB SYSTEMS

(71) Applicant: Applied Materials Israel Ltd., Rehovot (IL)

(72) Inventor: Yehuda Zur, Tel-Aviv (IL)

(73) Assignee: Applied Materials Israel Ltd., Rehovot (IL)

( * ) Notice: Subject to any disclaimer, the term of this patent is extended or adjusted under 35 U.S.C. 154(b) by 101 days.

(21) Appl. No.: 17/725,023

(22) Filed: Apr. 20, 2022

(65) Prior Publication Data

US 2023/0343545 A1    Oct. 26, 2023

(51) Int. Cl.
*H01J 37/20* (2006.01)
*H01J 37/305* (2006.01)

(52) U.S. Cl.
CPC .......... *H01J 37/20* (2013.01); *H01J 37/3056* (2013.01); *H01J 2237/006* (2013.01); *H01J 2237/31749* (2013.01)

(58) Field of Classification Search
CPC .. H01J 37/20; H01J 37/3056; H01J 2237/006; H01J 2237/31749
See application file for complete search history.

(56) References Cited

U.S. PATENT DOCUMENTS

| | | | |
|---|---|---|---|
| 6,586,736 B1 * | 7/2003 | McCord | H01J 37/28 250/397 |
| 6,670,610 B2 | 12/2003 | Shemesh et al. | |
| 7,910,884 B2 * | 3/2011 | Cheng | H01J 37/28 250/306 |
| 8,709,269 B2 | 4/2014 | Shemesh | |
| 2005/0230621 A1 * | 10/2005 | Edinger | H01J 37/3056 250/311 |
| 2009/0032724 A1 | 2/2009 | Lozano et al. | |
| 2015/0325403 A1 | 11/2015 | Maazouz | |
| 2020/0384592 A1 | 12/2020 | Zur | |
| 2022/0351937 A1 | 11/2022 | Zur et al. | |
| 2023/0023396 A1 | 1/2023 | Zur | |

FOREIGN PATENT DOCUMENTS

| | | |
|---|---|---|
| KR | 20070058724 A | 6/2007 |
| WO | 2021162770 A2 | 8/2021 |

OTHER PUBLICATIONS

PCT/US2023/018168, "International Search Report and the Written Opinion", dated Jul. 31, 2023, 9 pages.

* cited by examiner

*Primary Examiner* — Sean M Luck
(74) *Attorney, Agent, or Firm* — Kilpatrick Townsend & Stockton LLP (57) ABSTRACT

A method of processing a region of a sample, the method comprising: positioning a sample within a vacuum chamber; generating an ion beam with a focused ion beam (FIB) column; focusing the ion beam on the sample and scanning the focused ion beam across the region of the sample thereby generating secondary electrons that are ejected from a surface of the sample within the region; and during the scanning, applying a negative bias voltage to an electrically conductive structure proximate the region to alter a trajectory of the secondary electrons and repel the secondary electrons back to the sample surface, wherein the electrically conductive structure is one of a gas injection nozzle, a voltage pin or a nano-manipulator.

20 Claims, 12 Drawing Sheets

REDUCED CHARGING BY LOW NEGATIVE VOLTAGE IN FIB SYSTEMS

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen such as a silicon wafer that includes one or more integrated circuits (ICs) or other electronic structures formed thereon can be milled and imaged with a focused ion beam (FIB) to study specific characteristics of the circuits or other structures formed on the wafer.

As one example, a FIB can be used to mill a hole or trench in one or more layers formed on a sample. During such a milling process, ions bombard the sample setting off a series of events that can generate free electrons that escape from the surface of the sample. When the material being milled is a conductive layer, electrons from within the sample can quickly replace the escaping electrons maintaining a relatively neutral charge in the milled region. When the material being milled is a nonconductive (i.e., electrically insulative) layer, however, electrons do not move as freely through the material. Thus, electrons that escape or are otherwise released from the milled region during a milling process of a nonconductive material may not be replaced and the milled region can develop a positive charge that can adversely impact the milling process.

Accordingly, improved techniques for milling electrically nonconductive materials are desirable.

BRIEF SUMMARY OF THE INVENTION

Embodiments disclosed herein provide improved techniques and processes to mill a region on a sample to reduce or prevent the formation of a positive charge in the milled region even when the milled material is electrically nonconductive.

In some embodiments, a method of processing a region of a sample includes: positioning a sample within a vacuum chamber; generating an ion beam with a focused ion beam (FIB) column; focusing the ion beam on the sample and scanning the focused ion beam across the region of the sample thereby generating secondary electrons that are ejected from a surface of the sample within the region; and during the scanning, applying a negative bias voltage to an electrically conductive structure proximate the region to alter a trajectory of the secondary electrons and repel the secondary electrons back to the sample surface, wherein the electrically conductive structure is one of a gas injection nozzle, a voltage pin or a nano-manipulator.

Various implementations of the embodiments described herein can include one or more of the following features. The electrically conductive structure can be positioned five millimeters or less away from the region during the milling. The electrically conductive structure can include a gas injection nozzle positioned between a column cap of the FIB column and the sample. The gas injection nozzle can be heated while applying a negative bias voltage to the gas injection nozzle. During the scanning, a first end of the gas injection nozzle can be positioned adjacent to the region and a second end of the gas injection nozzle can extend through a conductive wall of a component of the vacuum chamber and be electrically isolated from but thermally coupled to the wall. The electrically conductive structure can include a voltage pin operable to be moved adjacent to within 100 microns of the region. The sample can include an electrically nonconductive layer formed on its upper surface and the focusing step can scan the focus ion beam across the region of the sample milling a portion of the electrically nonconductive layer. The sample can include a semiconductor substrate and during the scanning. The electrically conductive structure can be between 5 microns to 1.5 millimeters microns away from the region.

Some embodiments pertain to a non-transitory computer-readable medium that stores instructions that, when executed by one or more processors, cause the processors to: position a sample within a vacuum chamber; generate an ion beam with a focused ion beam (FIB) column; focus the ion beam on the sample and scan the focused ion beam across the region of the sample thereby generating secondary electrons that are ejected from a surface of the sample within the region; and during the scanning, apply a negative bias voltage to an electrically conductive structure proximate the region to alter a trajectory of the secondary electrons and repel the secondary electrons back to the sample surface, wherein the electrically conductive structure is one of a gas injection nozzle, a voltage pin or a nano-manipulator Some embodiments pertain to a system for performing milling a region of a sample according to any of the methods set forth above or herein. For example, the system can include: a vacuum chamber; a sample support configured to hold a sample within the vacuum chamber during a processing operation; a focused ion beam (FIB) column configured to direct an ion beam into the vacuum chamber toward the region of the sample during the processing operation; an electrically conductive structure moveable into a position such that, when the sample is positioned on the sample support, the electrically conductive structure is proximate the region of the sample, wherein the electrically conductive structure is one of a gas injection nozzle, a voltage pin or a nano-manipulator; and a voltage source operable to apply a negative bias voltage to the electrically conductive structure.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments disclosed herein provide improved techniques and processes to mill a region on a sample to reduce or prevent the formation of a positive charge in the milled region even when the milled material is electrically nonconductive.

Example Focused Ion Beam (FIB) Evaluation Tool

Figure 1:
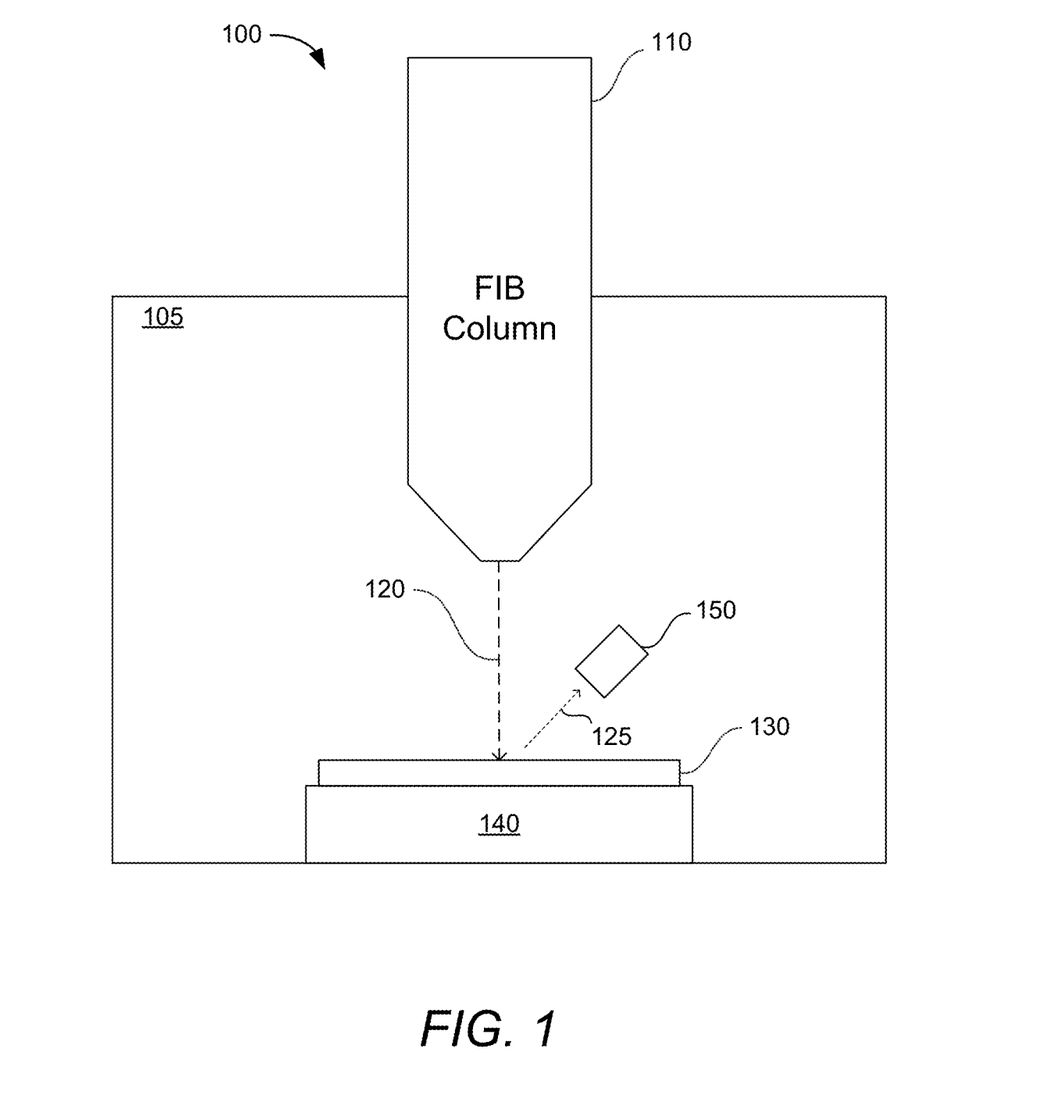
FIG. 1 is a simplified illustration of a sample focused ion beam (FIB) evaluation system according to some embodiments of the disclosure.

In order to better understand and appreciate the disclosure, reference is first made to FIG. 1, which is a simplified schematic illustration of a focused ion beam (FIB) evaluation system 100 according to some embodiments of the disclosure. As shown in FIG. 1, system 100 can include, among other elements, a focused ion beam (FIB) column 110, a sample supporting element 140 and a secondary electron detector 150 (or in some embodiments a secondary ion detector or a combination of the two detectors working in parallel). FIB column 110 is operable to generate a charged particle beam 120 and direct the particle beam towards a sample 130 (sometimes referred to herein as an "object" or a "specimen") to mill or otherwise process the sample. The sample, for example a semiconductor wafer, can be supported on supporting element 140 within a vacuum chamber 105.

FIB column 110 can mill (e.g., drill a recess in) sample 130 by irradiating the sample with charged particle beam 120 to form a cross section and, if desired, can also smooth the cross section. An FIB milling process typically operates by positioning the specimen in a vacuum environment and emitting a focused beam of ions towards the specimen to etch or mill away material on the specimen. In some instances the vacuum environment can be purged by controlled concentration of background gases that serve to help control the etch speed and quality or help control matter deposition. The accelerated ions can be generated from Xenon, Gallium or other appropriate elements and are typically accelerated towards the specimen by voltages in the range from 500 volts to 100,000 volts, and more typically falling in the range from 3,000 volts to 30,000 volts. The beam current is typically in the range from several pico amps to several micro amps, depending on the FIB instrument configuration and the application, and the pressure is typically controlled between $10^{-10}$ to $10^{-5}$ mbar in different parts of the system and in different operation modes.

A milling process can be done by, for example: (i) locating a location of interest that should be milled in order to remove a portion (e.g., a portion of one or more layers) of material from the sample, (ii) moving the sample (e.g., by the mechanical supporting element 140) so that the sample is located under the field-of-view of the FIB unit, and (iii) milling the sample to remove a desired amount of material in the location of interest. The milling process can include forming a recess in the sample (usually sized a few microns to few hundreds of microns in the lateral dimensions).

The milling process typically includes scanning a charged particle beam back-and-forth (e.g., in a raster or other scan pattern) across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of 150, 200 or 300 mm while each area scanned on the wafer (i.e., the area milled) can be a rectangular area having a width and/or length measured in microns or tens of microns. Each iteration (or frame) in which the ion beam is scanned across the region being milled is typically measured in microseconds and removes a very small amount of material (e.g., as low as 0.01 atomic layers using a low i-probe (e.g., 10 pA) or as much as 1000 atomic layers using a high i-probe (e.g., 1000 nA)) such that the scan pattern is repeated many thousands or even millions of times to etch a hole to a desired depth.

During a milling operation the charged particle beam 120 generated by FIB column 110 propagates through the vacuumed environment formed within vacuum chamber 105 before impinging on sample 130. The milling process generates byproducts such as molecules, atoms and ions of the material being milled along with secondary electrons. For example, as an ion hits the sample surface with a relatively high energy level, the ion can begin a collision cascade that transfers momentum and energy from the ion to the sample until the ion is stopped and implanted. The momentum and energy transfer during the collision cascade can cause the dislocation of atoms, the ionization of atoms and the generation of phonons (heat). The cascade can reach the sample surface causing the sputtering of atoms having enough momentum and energy to escape the solid sample and generating secondary ions and electrons as a combination of ionization and sputtering that also escape the sample surface. The secondary ions or secondary electrons (shown in FIG. 1 as secondary ions/electrons 125) can be detected by an appropriate detector 150. The detected secondary ions or secondary electrons can then be used to analyze characteristics of the milled layers and the structure.

While not shown in FIG. 1, FIB evaluation system 100 can include a number of additional components including, but not limited to, one or more gas nozzles to deliver process gases to chamber 105, vacuum and other valves to control the pressure within chamber 105, and one or more lenses to direct the charged particle beam among other components. System 100 can also include one or more controllers, processors or other hardware units that control the operation of system 100 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Accumulation of a Positive Charge on Sample

Figure 2:
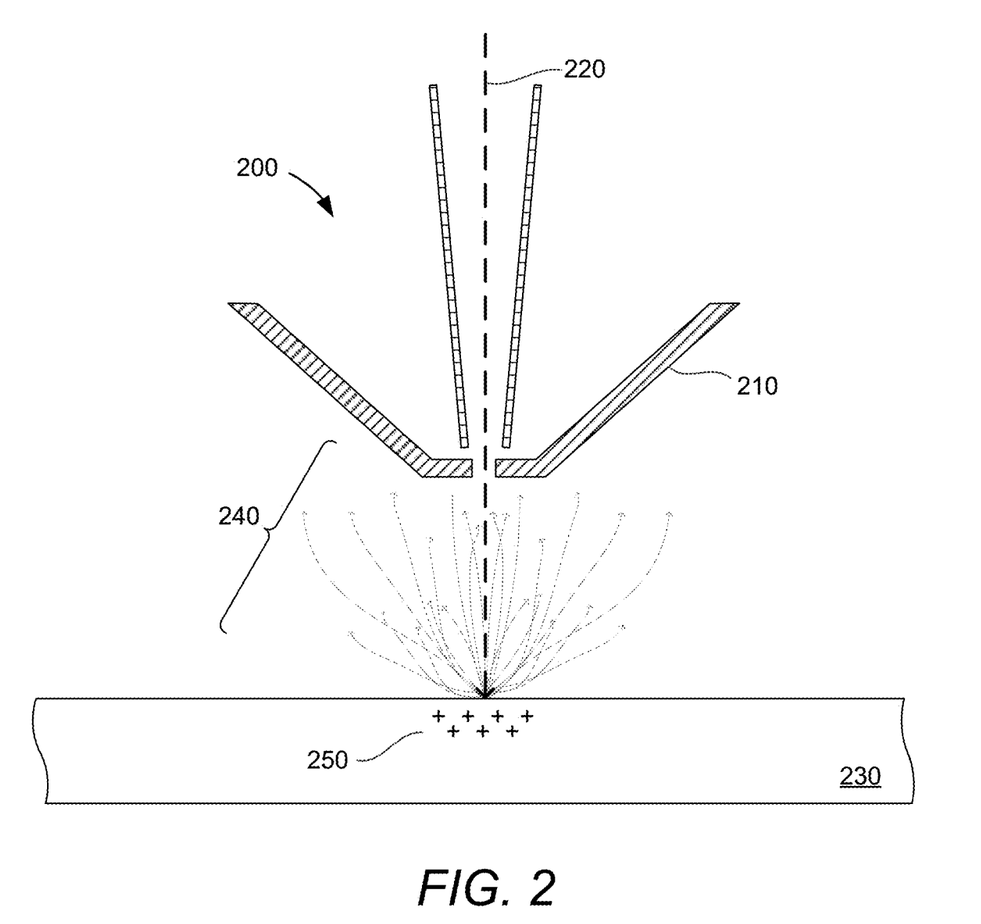
FIGS. 2 and 3 are simplified illustrations of a portion of previously known charged particle columns.

As mentioned above, when a sample is bombarded with an ion beam during a focused ion beam (FIB) milling process, secondary electrons can be generated that escape from the sample. To illustrate, references is made to FIG. 2, which is a simplified schematic view of a portion of an FIB column 200 spaced apart from a sample 230. FIB column 200 can be representative of FIB column 120 shown in FIG. 1. For ease of illustration, only selected elements of FIB column 200 are shown in FIG. 2. As shown, the FIB column 200 includes a column cap 210 at the distal end of the column.

During a milling operation, the FIB column 200 generates an ion beam 220 and directs the electron beam such that the beam impinges sample 230. The interaction of the ion beam with the sample 230 generates various secondary electrons, some of which are ejected from the sample as shown by secondary electrons 240. When the layer being milled within sample 230 is an electrically nonconductive layer, the ejected secondary electrons are not readily replaced by other electrons within the sample 230. Thus, a positive charge can build up within a region 250 of the sample being milled. As noted above, the positive charge can have an adverse impact on ion beam 220 by, for example, deflecting the beam away from its intended trajectory.

Figure 3:
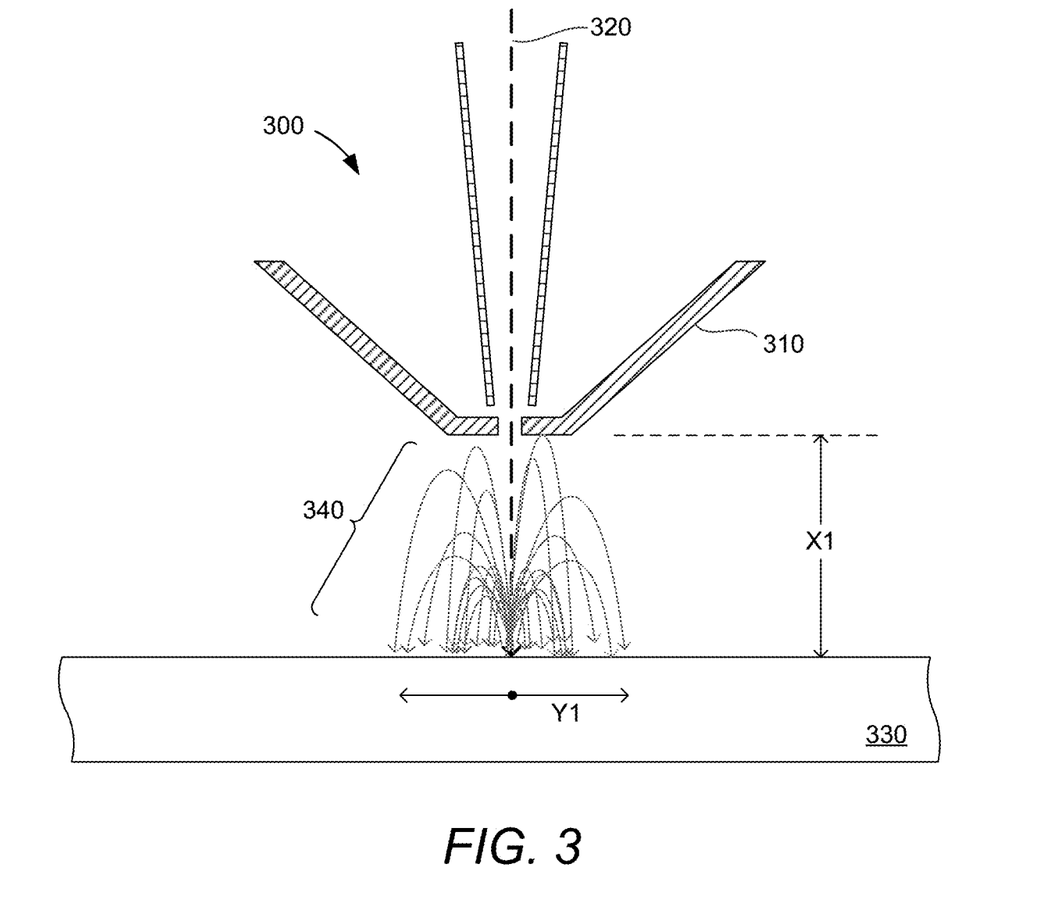

In some known sample evaluation systems, a negative voltage can be applied to a charged particle column to repel secondary electrons back towards the sample and maintain a neutral charge at the surface of the sample. For example, FIG. 3 is a simplified schematic view of a portion of a charged particle column 300 spaced apart from a sample 330. Charged particle column 300 can include the same or similar components as column 200 and is shown as generating a charged particle beam 320 that is directed through an opening of a column cap 310 towards sample 330. During a processing operation in which the charged particle beam is directed to impinge upon sample 330, a negative voltage can be applied to the column cap 310 that is sufficient to repel ejected secondary electrons 340 back towards sample 330. In this manner, charged particle column 300 can avoid forming a strong positive charge across the surface of sample 330.

In practice, however, the column cap 310 and the detector (e.g., secondary electron detector) are each spaced a distance X1 that is several millimeters or more away from the upper surface of sample 330. For example, in a typical milling operation, column cap 310 can be spaced about 10-15 mm away from the sample surface and the secondary electron detector can be spaced a similar distance away off to one side of the milled region. Thus, as illustrated in FIG. 3, even if a negative voltage is applied to column cap 310, the relatively large spacing (millimeter range) between the column cap 310 and the sample can result in the repelled secondary electrons 340 being returned to sample 330 in a region having a radius of approximately Y1 that can be several millimeters or more away from the area in which the ion beam impinges upon sample 330. When the ion beam is directed towards the sample with micron scale accuracy, the repelled electrons may not counteract the build-up of positive charge in the immediate vicinity of the beam, which can thus still result in undesirable effects during the milling process. Additionally, in order to efficiently repel electrons from such a distance, a relatively strong electric potential is required that can interfere with the optics of the primary ion beam emerging from the column.

Applying a Negative Voltage to a Structure in Close Proximity to the Milled Region According to some embodiments disclosed herein, a negative bias voltage can be applied to an electrically conductive structure that is in close proximity to the milled region to repel the secondary electrons back to the surface of the sample in the same general area from which they are ejected from the sample. As used herein, "close proximity" refers to distances between about 5 microns to less than 5 millimeters. And, in various embodiments, a negative bias voltage is applied to an electrically conductive structure that is 2 millimeters or less from the milled region, between 5 microns and 1.5 millimeters from the milled region and/or 5 microns and 700 microns from the milled region, which are essentially distances that are at least several times closer to the milled region than the column cap (and in many instances a full order of magnitude or more closer).

As described below, in some embodiments, the electrically conductive structure can be one or more of a gas injection nozzle, a voltage pin, a nano-manipulator and/or any appropriate electrically conductive structure that can be positioned within close proximity (as defined above) to the milled region without interfering with the ion beam while a negative bias voltage is applied to the conductive structure.

1. Gas Injection Nozzle

Figure 4:
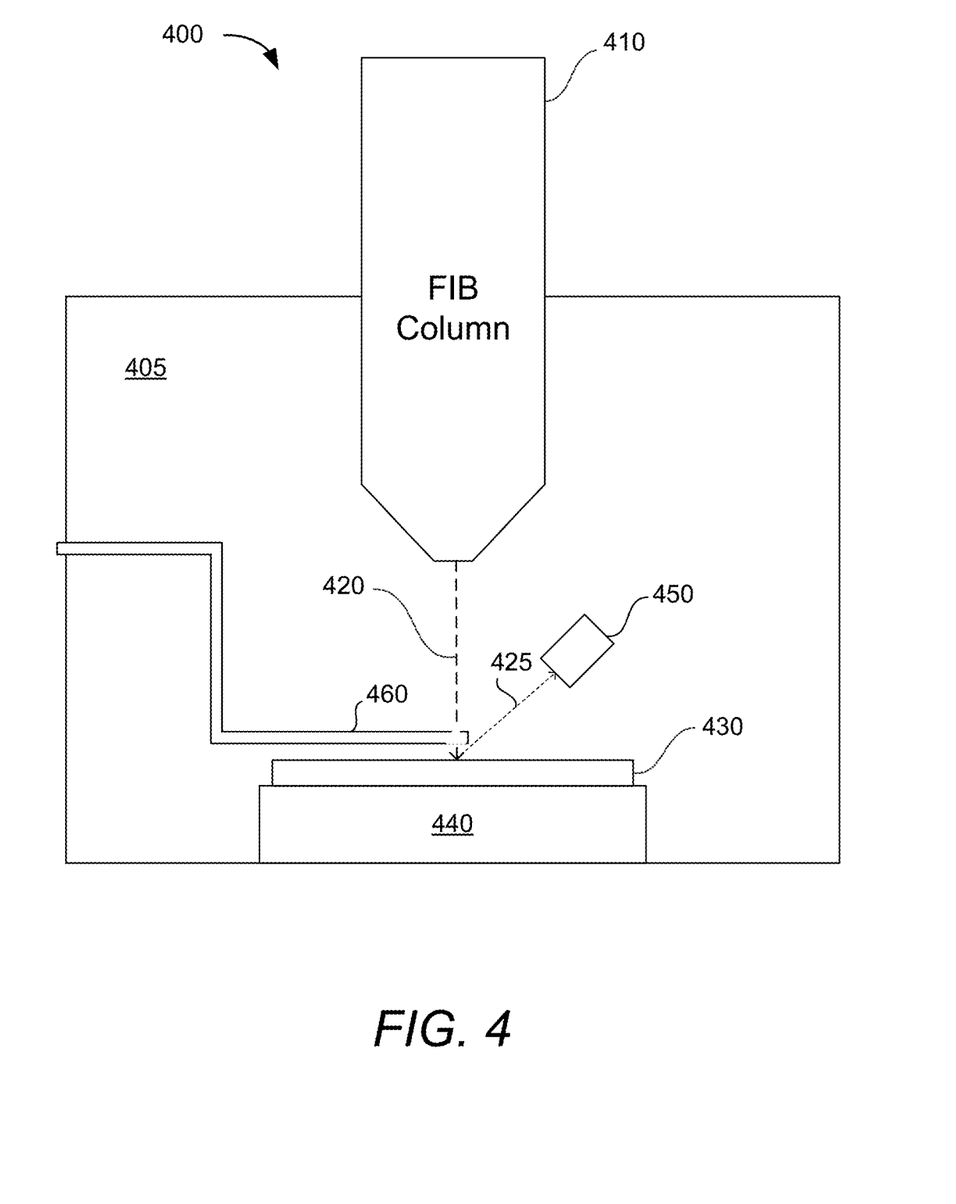
FIG. 4 is a simplified illustration of a sample focused ion beam (FIB) evaluation system according to some embodiments of the disclosure.

Reference is now made to FIG. 4, which is a simplified illustration of a focused ion beam (FIB) evaluation system 400 in accordance with some embodiments. System 400 can be similar to system 100 and includes a FIB column 410 that can direct an ion beam 420 towards a sample 430 positioned on a sample support 440. System 400 can also include a secondary electron or ion detector 450 that detects secondary electrons or ions 425 generated during a milling operation.

FIB evaluation system 400 further includes a gas injection nozzle 460 positioned between the distal end of FIB column 410 and the sample 430. In some embodiments, gas injection nozzle 460 can be in a fixed relationship in the X and Y planes with respect to FIB column 410 and moveable within the Z plane to allow the nozzle to get in close proximity (e.g., as close as 300 microns in some embodiments) to an upper surface of sample 430. In some embodiments, gas injection nozzle 460 can includes a hole or channel formed through the gas injection nozzle that allows ion beam 420 to pass through the gas injection nozzle and collide with sample 430 at a location directly below the nozzle as discussed below with respect to FIGS. 6A-6C.

Figure 5:
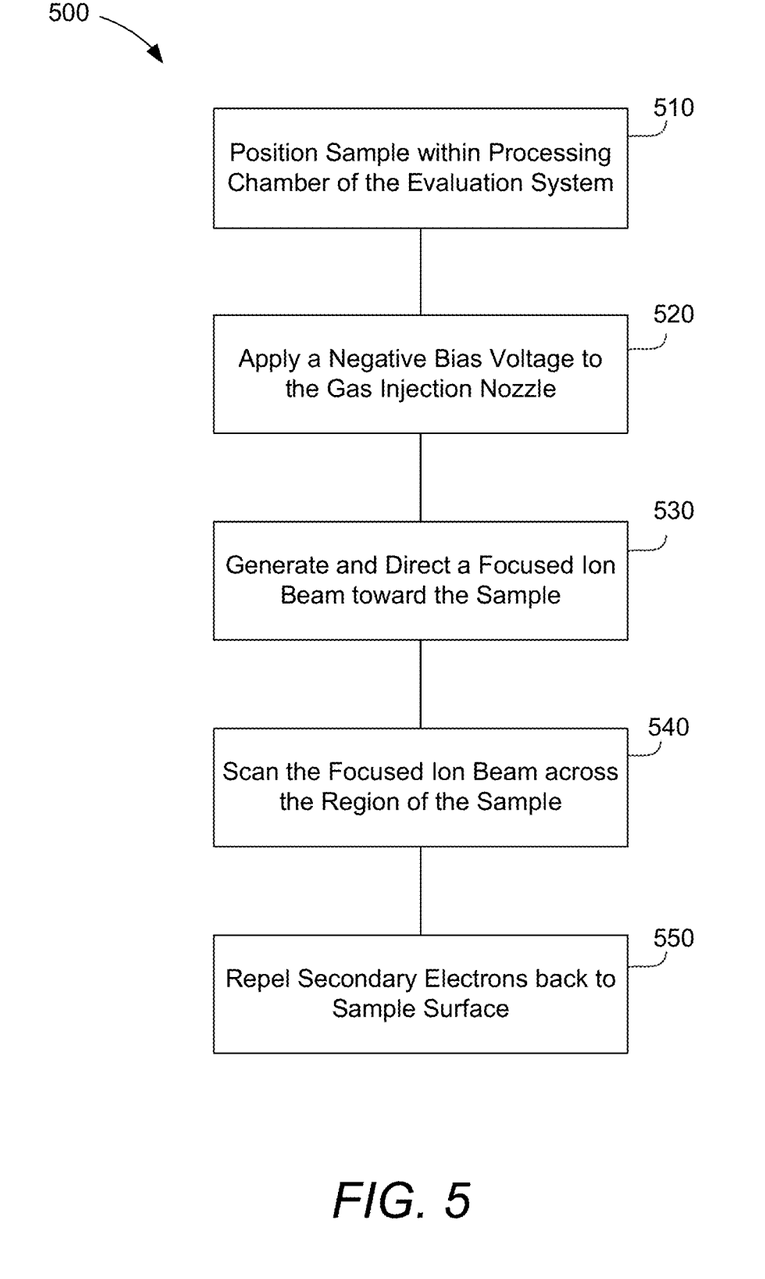
FIG. 5 is a simplified flow chart depicting steps associated with a method of milling a sample according to some embodiments.
Figure 6A:
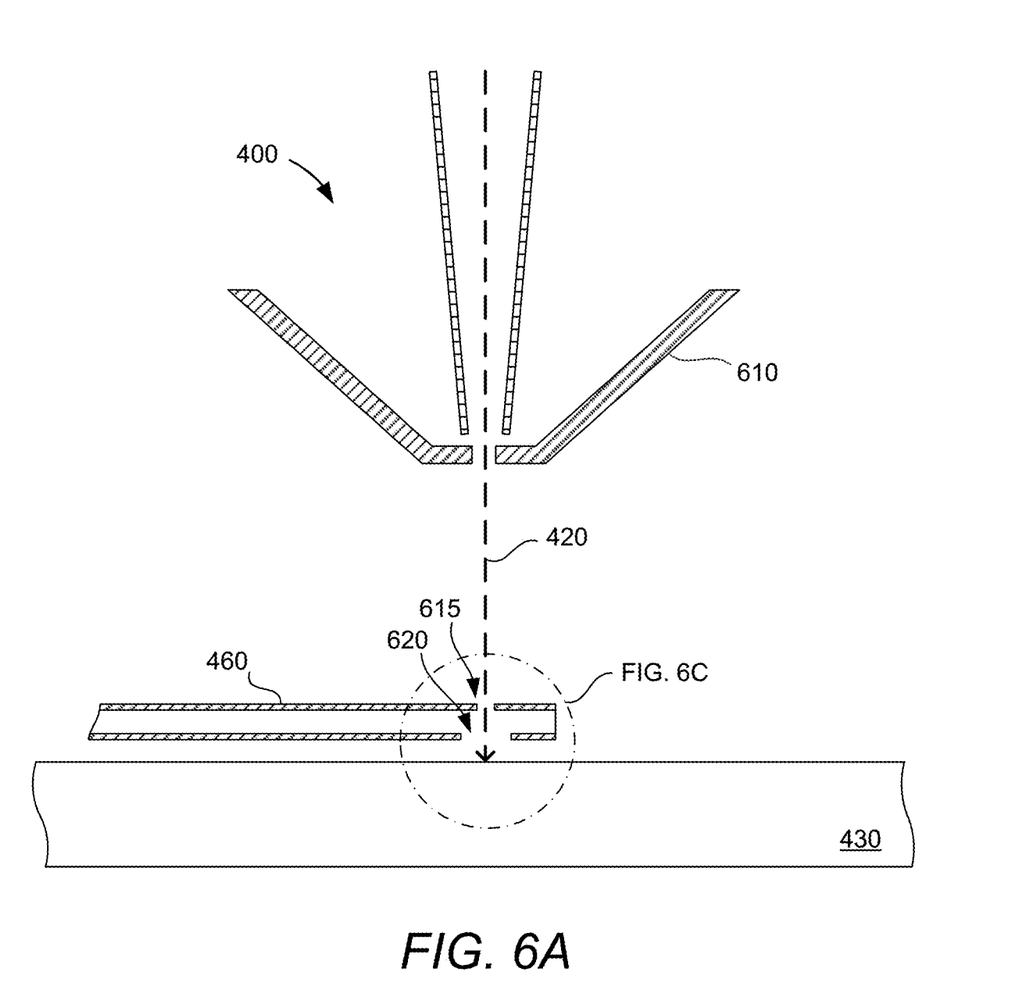
FIG. 6A is a simplified illustration of a portion of an FIB column and gas nozzle according to some embodiments.
Figure 6B:
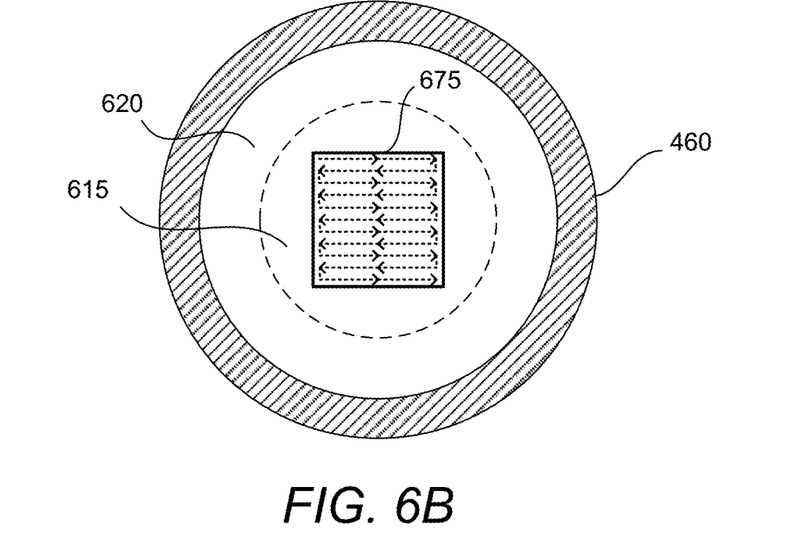
FIG. 6B is a simplified plan view illustration depicting a portion of the gas injection nozzle shown in FIG. 6A positioned over a sample being milled.
Figure 6C:
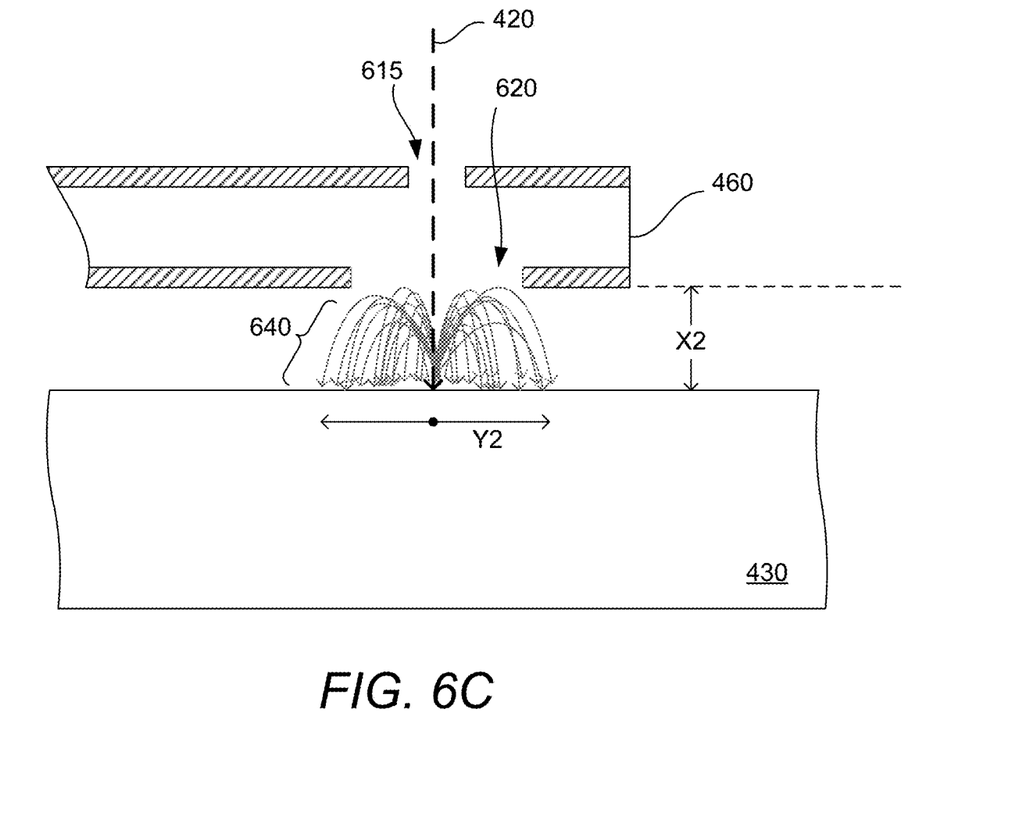
FIG. 6C is a simplified illustration of a gas injection nozzle according to some embodiments positioned over a sample being milled.

Prior to discussing FIGS. 6A-6C, however, reference is made to FIG. 5, which is a simplified flow chart depicting steps associated with a method 500 of milling a sample according to some embodiments. Method 500 starts by positioning a sample, such as semiconductor wafer having an electrically nonconductive layer formed thereon, within a processing chamber of a sample evaluation system (step 510). The processing chamber, which can be, for example, chamber 405, can include an focused ion beam (FIB) column, such as FIB column 410 and a gas injection nozzle, such as nozzle 460. Step 510 can include positioning the sample within the vacuum chamber on a sample support, such as support 440.

Next, a negative bias voltage is applied to the gas injection nozzle (step 520) and the FIB column can be activated to generate an ion beam (step 530) that is focused and scanned across a region of interest on the sample (step 540). The ion beam can be focused by a focusing lens (not shown in FIG. 4) and scanned across a region of the substrate with one or more deflecting lenses (also not shown in FIG. 4).

While the ion beam is scanned across the region of interest, the negative bias voltage is applied to the gas injection nozzle. The negative bias voltage should be sufficiently high to repel secondary electrons that escape from a surface of the sample back to the sample, but it should not be so high as to impact the trajectory of ion beam 420 which would adversely impact the milling process. While the negative bias voltage is applied to the gas injection nozzle, and while the ion beam is scanned across the region of interest, secondary electrons that are ejected from the sample are repelled back into the sample thus maintaining a relatively neutral charge in the milled region. Thus, while FIG. 5 depicts steps 520-550 as separate sequential steps, in practical terms, steps 520-550 can occur simultaneously with each other.

In some embodiments, the negative bias voltage can be the minimum voltage that is required to repel a predetermined percent of the secondary electrons. Suitable values of the negative bias voltage will depend, in part, on the geometry of the gas injection nozzle, the spacing of nozzle to the sample and the predetermined percentage of secondary electrons that are to be repelled back into the sample. Suitable negative bias voltages can thus be determined by simulations or by experiments as can be readily determined by a person of skill in the art. In some embodiments, the bias voltage can be between negative 50 and negative 1000 volts; and in other embodiments the bias voltage can be between negative 100 and negative 500 volts.

While FIG. 5 discusses a method in conjunction with a milling operation of an electrically nonconductive layer, it is to be understood that in other embodiments. Additionally, while FIG. 5 discusses an embodiment in which a negative voltage is applied to a gas injection nozzle, it is understood that the same or similar techniques can be used in conjunction with other conductive structures described herein for such purposes including a voltage pin, a nano-manipulator and the like.

Reference is now made to FIG. 6A, which is a simplified illustration of gas injection nozzle 460 shown in FIG. 4, and FIG. 6B, is a simplified plan view illustration of a portion of gas injection nozzle 460. As shown, gas injection nozzle 460 includes a channel 615 that extends all the way through the nozzle 460, from an upper surface of nozzle 460 to a lower surface of the nozzle. Channel 615 can have a circular cross-section and can be centered around ion beam 420 such that the ion beam traverses through channel 615 of the gas injection nozzle 460 before impinging upon sample 430 (e.g., as shown in FIG. 6B as region 675). Nozzle 460 also includes an opening 620 at a bottom surface of the nozzle adjacent to an upper surface of sample 430. Gases that flow through nozzle 460 can be distributed to the surface of sample 430 through the opening 620. As shown in FIG. 6B, the opening 620 can also have a circular cross-section, can encompass channel 615 and can symmetrically surround the region 675 on sample 430 in which ion beam 420 contacts and mills the sample. In this manner, gases delivered by nozzle 460 can be delivered directly to the region 675 of sample 430 being milled.

As shown in FIGS. 4 and 6A, gas injection nozzle 460 is much closer to sample 430 than either column tip 610 or the secondary ion detector (not shown). For example, nozzle 460 can be an order of magnitude or more closer to region on the upper surface of sample 430 being milled than the closest portion of focused ion beam column is to the milled region.

In previously known systems, substrate support 440 and gas nozzle 460 are typically electrically grounded. Some embodiments disclosed herein, however, apply a negative voltage to gas injection nozzle 460 to repel secondary electrons generated from the milling operation back to the sample in a manner similar to that discussed above with respect to column tip 310 (FIG. 3). To illustrate reference is made to FIG. 6C, which is a simplified illustration of a portion of gas injection nozzle 460 positioned over a sample 430 being milled. Because gas nozzle 460 is much closer to the milled region than column tip 310 (or column tip 610), applying an appropriate negative voltage level to the gas nozzle 460 will repel the secondary electrons 640 back to a region of the sample that has a much smaller radius, and is thus much closer to the milled region, than the secondary electrons repelled back to sample 330 by column tip 310. In some embodiments, the lower surface of nozzle 460 can be spaced a distance X2 that is measured in tens or hundreds of microns away from the upper surface of sample 430. As a non-limiting example, in some milling operations, the lower surface of nozzle 460 can be spaced about 200-700 microns away from the sample surface.

The design of gas nozzle 460, which completely and symmetrically surrounds the milled region as shown in FIG. 6B, and the extremely close spacing (micron range) between gas nozzle 460 and the sample can result in the repelled secondary electrons 640 being returned to sample 430 in a region centered around the milled region and having a radius of approximately Y2 measured in tens of microns as opposed to millimeters (and thus be at least an order of magnitude or two orders of magnitude or more less than Y1). Thus, the secondary electrons can be repelled back to an area on the sample that is within the same general vicinity (as measured in microns) as the region being milled which enables the milled region to maintain a neutral charge even when the material being milled is electrically nonconductive.

2. Electrically Isolating the Gas Injection Nozzle

Figure 7:
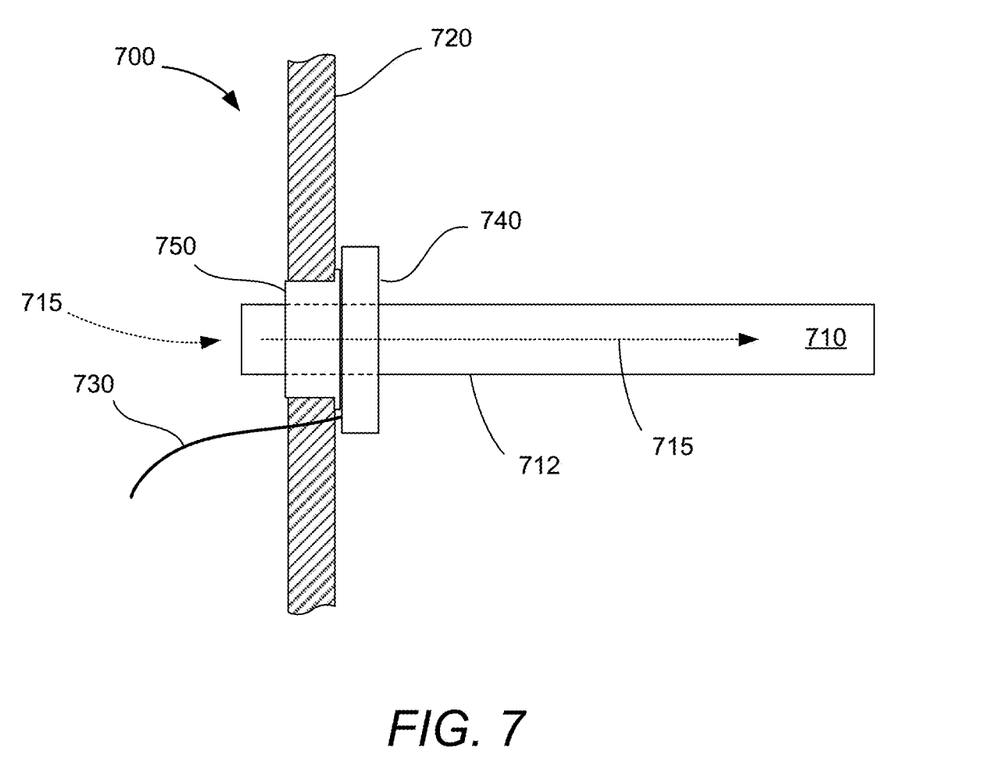
FIG. 7 is a simplified illustration of a gas nozzle connection system according to some embodiments.

In order for gas nozzle 460 to be charged with a negative voltage, the nozzle needs to be electrically isolated from other portions of system 400 that are grounded. FIG. 7 is a simplified illustration of a gas nozzle connection system 700 according to some embodiments that can electrically decouple a gas nozzle from other portions of system 400. As shown, nozzle connection system 700 can enable a gas injection nozzle 710, which can be representative of gas injection nozzle 460, to be charged with its own electric potential by supplying a negative voltage to the gas nozzle 710. As shown in FIG. 7, gas nozzle 710 includes an end portion 712 that can extend through a wall 720. Gas nozzle 710 and wall 720 can be made from an electrically conductive material, such as a metal. In some embodiments wall 720 can be a wall of vacuum chamber, such as chamber 105 or 405, of an FIB evaluation system, such as system 100 or 400. In other embodiments wall 720 can be a wall of a gas box that includes various valves and pipes (not shown) to control the flow of one or more gases into gas nozzle 710 where the gas box is be positioned within a vacuum chamber, such as chamber 105 or 405. In either case, gases can be piped through nozzle 710 in the direction indicated by arrows 715 and wall 720 can be electrically grounded.

An insulated electrical feed line 730 can extend through wall 720 and be electrically coupled to a thermally conductive electrode 740. When a voltage is applied to feed line 730, electrode 740 transfers the applied voltage to the gas nozzle.

For some applications it is important to heat nozzle 460 in order to avoid deposition of material from gases flowing through the nozzle that might interfere with gas flow to the milled region or clog the nozzle entirely. Towards this end, gas nozzle 460 can be electrically isolated from the chamber walls and/or other components within the chamber by an electrically-isolating but thermally conductive o-ring 750 or similar structure (e.g., an electrically-isolating, thermally conductive paste). A heater element (not shown) can be operatively connected to wall 720 and gas nozzle 710 to heat both the wall and the nozzle to a sufficient temperature to prevent or otherwise reduce deposition within the gas nozzle. The electrically-isolating but thermally conductive o-ring 750 allows heat to transfer between the two components while allowing the electrical potential of gas nozzle 710 to be decoupled from that of wall 720.

3. Voltage Pin/Nano-Manipulator

Figure 8A:
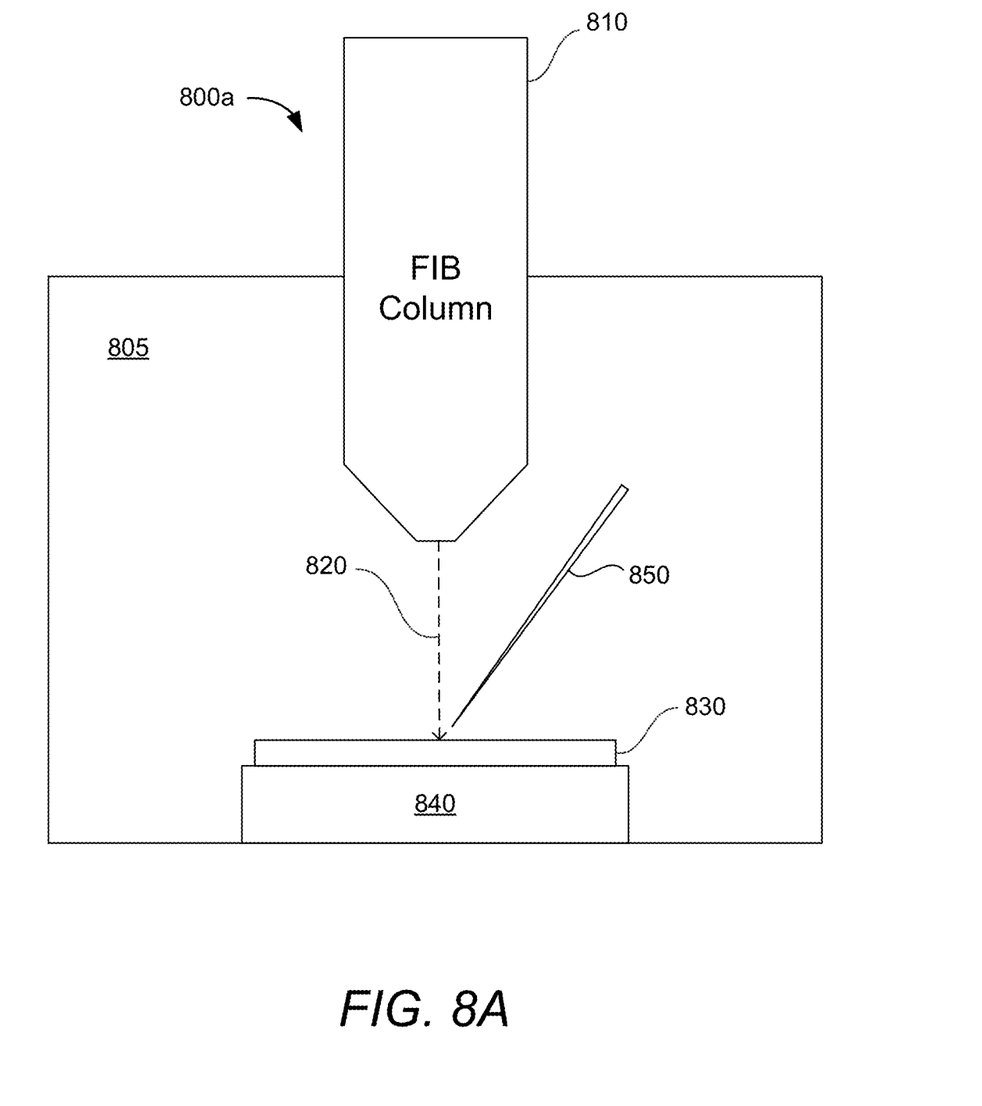
FIG. 8A is a simplified illustration of a sample focused ion beam (FIB) evaluation system according to some embodiments.
Figure 8B:
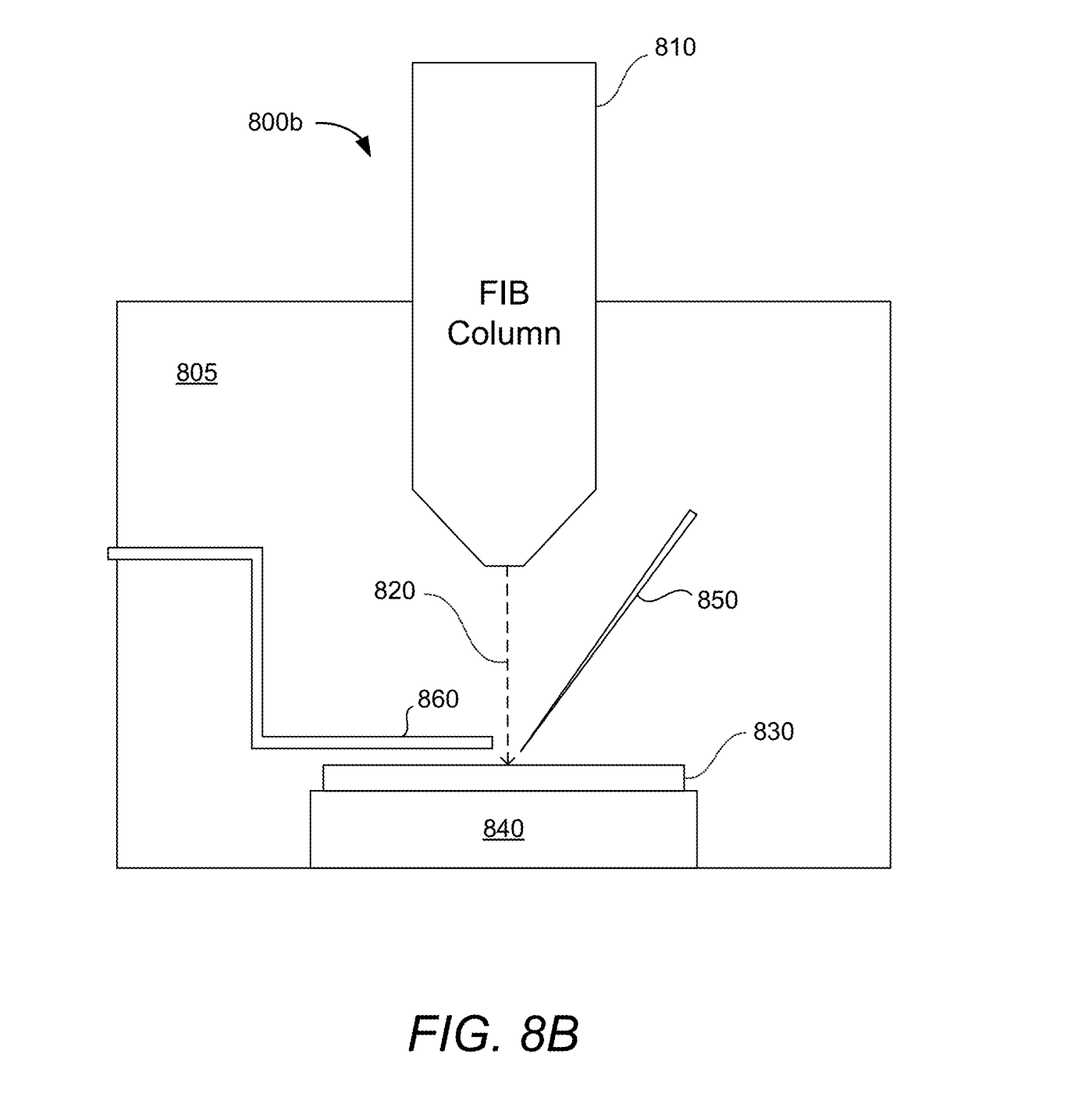
FIG. 8B is a simplified illustration of a sample focused ion beam (FIB) evaluation system according to some embodiments.

In some embodiments, in addition to or instead of applying a negative voltage to a gas injection nozzle or similar structure positioned in close proximity to the milled region (e.g., less than 1 millimeter), a voltage pin (e.g., a structure in which the sole or primary purpose is to apply a voltage proximate the region being milled or imaged), a nano-manipulator or a similar structure can be included within the system that can be moved into a position in close proximity to the milled region. FIGS. 8A and 8B are simplified illustrations of focused ion beam (FIB) evaluation systems 800a and 800b, respectively, according to some embodiments. Each of FIB evaluation systems 800a and 800b can be similar to systems 100 and 400 discussed above and include an FIB column 810 that can direct an ion beam 820 towards a sample 830 positioned on a sample support 840. Systems 800a and 800b can also include a secondary ion detector (not shown in either of FIG. 8A or 8B) that detects secondary ions generated during a milling operation and a gas injection nozzle 860 that is positioned to introduce one or more gases to the area being milled.

As depicted in FIGS. 8A and 8B, system 800a does not include a gas injection nozzle while system 800b includes a gas nozzle 860 that directs gas from a position off to the side of the milled region as opposed to gas nozzle 460 (FIG. 4) which introduced gas directly above the milled region. Each of systems 800a and 800b further include a voltage application structure 850 that can be positioned in close proximity (e.g., less than 1 millimeter away from) to the region on sample 830 being milled by ion beam 820. In some embodiments, voltage application structure can be positioned less than 100 microns from the milled region, and in some embodiments the voltage application structure can be positioned within tens of microns from the milled region. In some embodiments the voltage application structure 850 can be freely moved within the processing chamber independent of the FIB column and other components, and in some embodiments the voltage application structure 850 can be physically connected to, and moved with, the gas injection nozzle.

Voltage application structure 850 can be operatively coupled to a voltage source, and once positioned properly, can apply a negative voltage in close proximity to the milled area. In this manner, voltage application structure 850 can repel secondary electrons that escape from the sample during a milling process back to the sample surface as discussed above with respect to FIG. 6C.

Figure 8C:
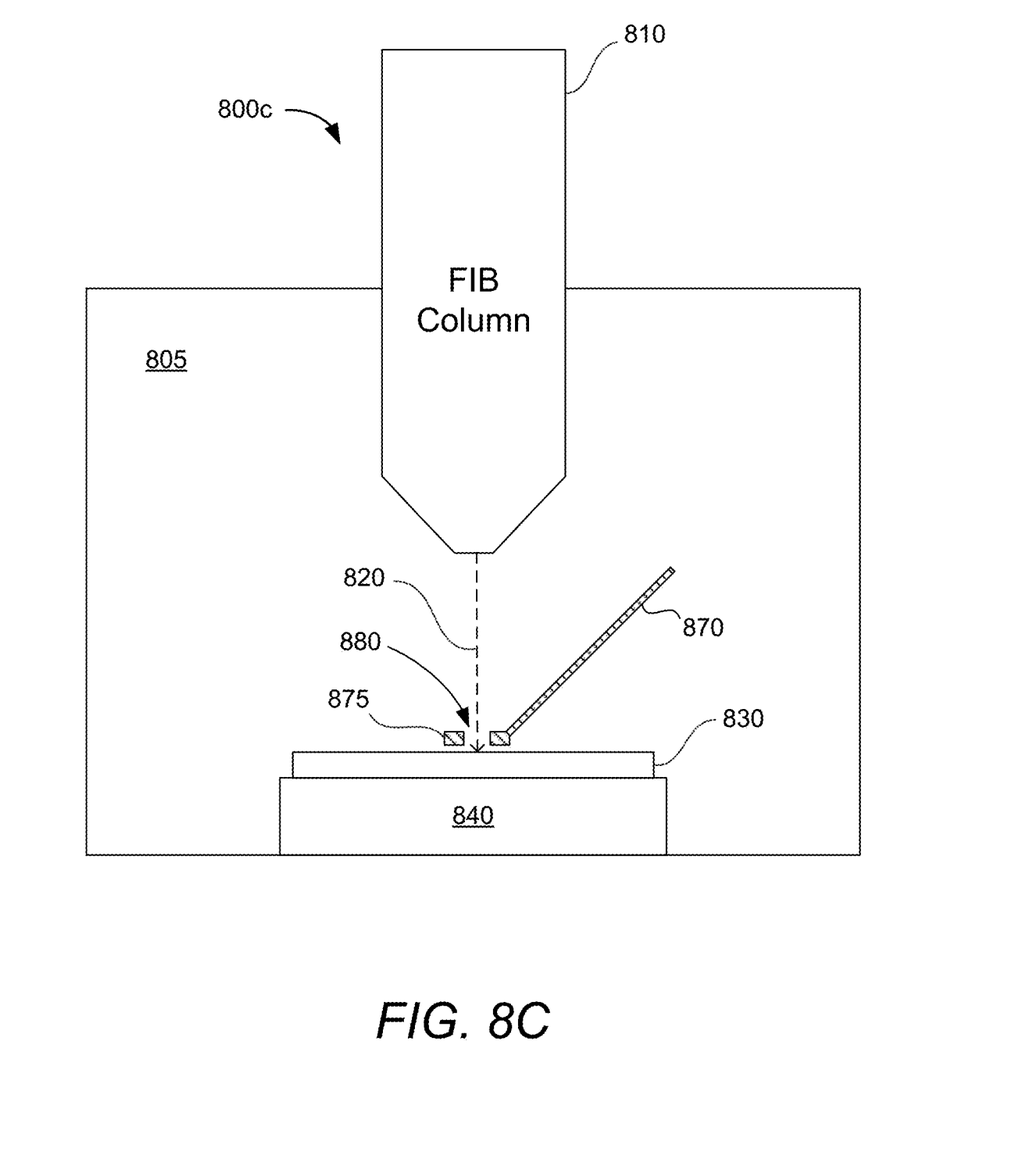
FIG. 8C is a simplified illustration of a sample focused ion beam (FIB) evaluation system according to some embodiments.

As shown in FIG. 8C, in still other embodiments a voltage application structure 870 can include an electrically conductive ring-shaped structure 875 at its tip that includes an inner opening 880 through which ion beam can pass. Opening 880 can be very small (e.g., less than 1 mm in diameter) and structure 875 can be positioned very close to the upper surface of sample 830, such that when an appropriate negative voltage is applied to structure 875, secondary electrons can be repelled back to the surface of sample 830 in the same manner as described above in FIG. 6C with respect to gas nozzle 460.

Example of a Sample to be Milled

Figure 9:
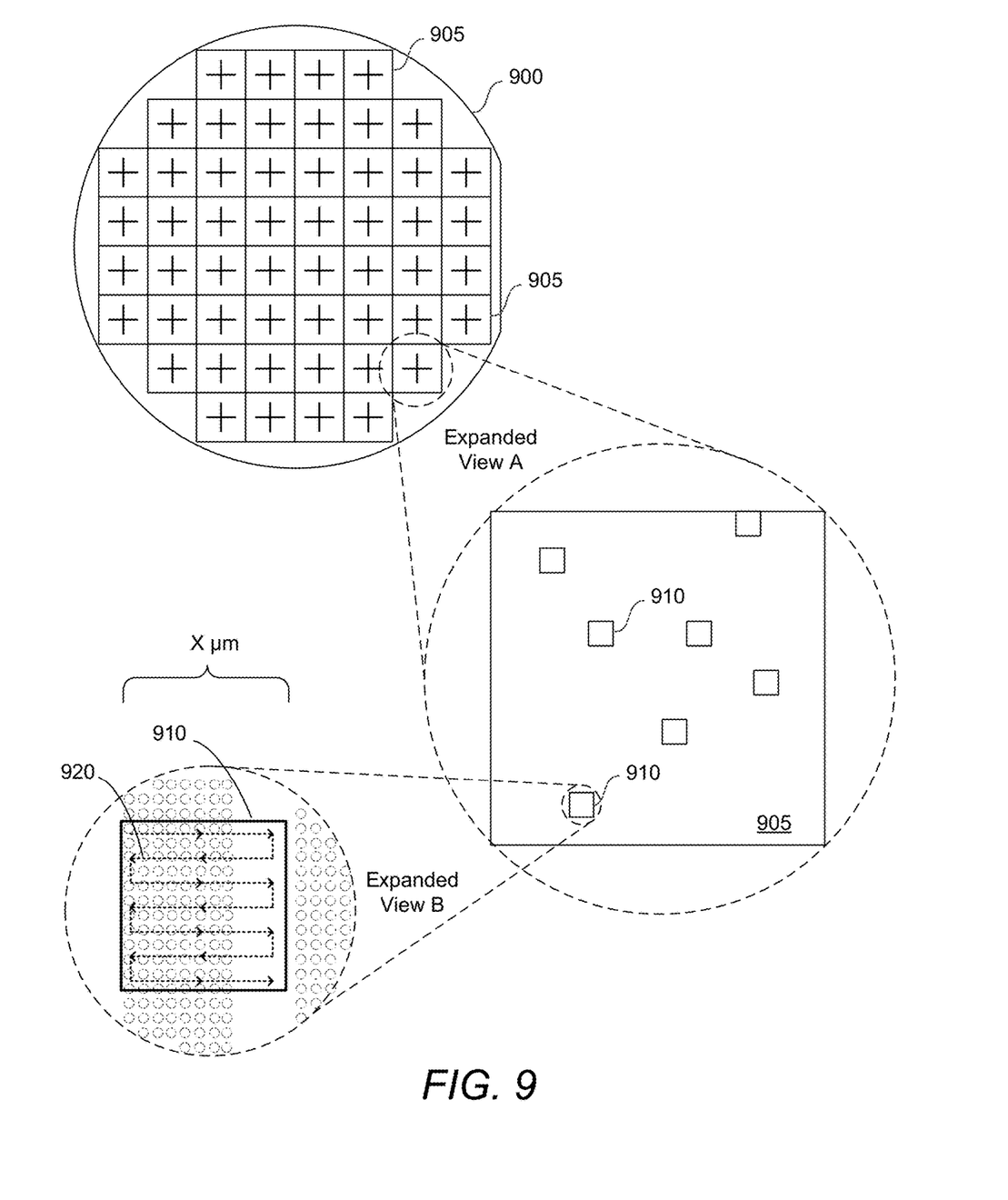
FIG. 9 is a simplified illustration of an area on a semiconductor wafer on which one or more regions can be milled according to some embodiments.

As stated above, embodiments of the disclosure can be used to mill or image many different types of samples including electronic circuits formed on semiconductor structures, solar cells formed on a polycrystalline or other substrate, nanostructures formed on various substrates and the like. As one non-limiting example, FIG. 9 is a simplified illustration of an area on a semiconductor wafer that can be milled according to some embodiments. Specifically, FIG. 9 includes a top view of wafer 900 along with two expanded views of specific portions of wafer 900. Wafer 900 can be, for example, a 150 mm, a 200 mm or 300 mm semiconductor wafer and can include multiple integrated circuits 905 (fifty two in the example depicted) formed thereon. The integrated circuits 905 can be at an intermediate stage of fabrication and the milling techniques described herein can be used to evaluate and analyze one or more regions 910 of the integrated circuits that include two or more sections adjacent to each other that exhibit different milling rates. For example, Expanded View A of FIG. 9 depicts multiple regions 910 of one of the integrated circuits 905 that can be evaluated and analyzed according to the techniques described herein. Expanded View B depicts one of those regions 910 that includes various electronic structures formed within the region.

Embodiments of the disclosure can analyze and evaluate the regions 910 using, for example, method 500 discussed above with respect to FIG. 5. The evaluating can be done by scanning the SEM beam back and forth within the region 910 according to a raster pattern, such as the scan pattern 920 depicted in a simplified format in the Expanded View B of FIG. 9.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings.

Also, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Because the illustrated embodiments of the present disclosure may for the most part, be implemented using electronic components and equipment known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

Additional Embodiments

Any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutatis mutandis to a system that is configured to executing instructions stored in the computer program product.

Where the illustrated embodiments of the present disclosure can, for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

The foregoing description, for purposes of explanation, used specific nomenclature to provide a thorough understanding of the described embodiments. However, it will be apparent to one skilled in the art that the specific details are not required in order to practice the described embodiments. For example, while various embodiments were described above with respect to applying a negative voltage to a gas nozzle or voltage application structure during a milling operation, the same concepts can be beneficially applied to an imaging operation in which secondary ions are collected while an ion beam is directed toward the substrate. In such operations, when an electrically nonconductive material is exposed to an ion beam during an imaging process, embodiments described herein can prevent or greatly reduce a positive charge from building up in the area being imaged by repelling secondary electrons back to the sample.

Thus, the foregoing descriptions of the specific embodiments described herein are presented for purposes of illustration and description. They are not target to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings.

What is claimed is:

1. A method of processing a region of a sample, the method comprising:
   positioning a sample within a vacuum chamber;
   generating an ion beam with a focused ion beam (FIB) column;
   focusing the ion beam on the sample and scanning the focused ion beam across the region of the sample thereby generating secondary electrons that are ejected from a surface of the sample within the region; and
   during the scanning, applying a negative bias voltage to an electrically conductive structure proximate the region to alter a trajectory of the secondary electrons and repel the secondary electrons back to the sample surface, wherein the electrically conductive structure is one of a gas injection nozzle, a voltage pin or a nano-manipulator.

2. The method of claim 1 wherein, during the scanning, the electrically conductive structure is positioned five millimeters or less away from the region.

3. The method of claim 1 wherein the electrically conductive structure comprises a gas injection nozzle positioned between a column cap of the FIB column and the sample.

4. The method of claim 3 further comprising heating the gas injection nozzle while applying a negative bias voltage to the gas injection nozzle.

5. The method of claim 4 wherein, during the scanning step, a first end of the gas injection nozzle is positioned adjacent to the region and a second end of the gas injection nozzle extends through a conductive wall of a component of the vacuum chamber and is electrically isolated from and thermally coupled to the wall.

6. The method of claim 1 wherein the electrically conductive structure comprises a voltage pin operable to be moved adjacent to within 100 microns of the region.

7. The method of claim 1 wherein the sample includes an electrically nonconductive layer formed on its upper surface and the focusing step scans the focus ion beam across the region of the sample milling a portion of the electrically nonconductive layer.

8. The method of claim 1 wherein the sample comprises a semiconductor substrate and during the scanning, the electrically conductive structure is positioned between 5 microns to one and a half millimeters microns away from the region.

9. A system for processing a region of a sample, the system comprising:
   a vacuum chamber;
   a sample support configured to hold a sample within the vacuum chamber during a processing operation;
   a focused ion beam (FIB) column configured to direct an ion beam into the vacuum chamber toward the region of the sample during the processing operation;
   an electrically conductive structure moveable into a position such that, when the sample is positioned on the sample support, the electrically conductive structure is proximate the region of the sample, wherein the electrically conductive structure is one of a gas injection nozzle, a voltage pin or a nano-manipulator; and
   a voltage source operable to apply a negative bias voltage to the electrically conductive structure.

10. The system set forth in claim 9 wherein the electrically conductive structure is positioned one and a half millimeters or less away from the region of the sample.

11. The system set forth in claim 9 further comprising a processor and a memory coupled to the processor, the memory including a plurality of computer-readable instructions that, when executed by the processor, cause the system to:
   position a sample within a vacuum chamber;
   generate an ion beam with a focused ion beam (FIB) column;
   focus the ion beam on the sample and scanning the focused ion beam across the region of the sample thereby generating secondary electrons that are ejected from a surface of the sample within the region; and
   during the scanning, apply a negative bias voltage to the electrically conductive structure proximate the region of the sample to alter a trajectory of the secondary electrons and repel the secondary electrons back to the sample surface.

12. The system set forth in claim 9 wherein the electrically conductive structure is a gas injection nozzle.

13. The system set forth in claim 12 further comprising heating the gas injection nozzle while applying a negative bias voltage to the gas injection nozzle.

14. The system set forth in claim 12 wherein, during the scanning step, a first end of the gas injection nozzle is positioned adjacent to the region and a second end of the gas injection nozzle extends through a conductive wall of a component of the vacuum chamber and is electrically isolated from and thermally coupled to the wall.

15. The system set forth in claim 9 wherein the sample includes an electrically nonconductive layer formed on its upper surface and the focusing step scans the focus ion beam across the region of the sample milling a portion of the electrically nonconductive layer.

16. A non-transitory computer-readable memory comprising a plurality of computer-readable instructions that, when executed by one or more processors, cause the processors to:
   position a sample within a vacuum chamber;
   generate an ion beam with a focused ion beam (FIB) column;
   focus the ion beam on the sample and scan the focused ion beam across the region of the sample thereby generating secondary electrons that are ejected from a surface of the sample within the region; and
   during the scanning, apply a negative bias voltage to an electrically conductive structure proximate the region to alter a trajectory of the secondary electrons and repel the secondary electrons back to the sample surface, wherein the electrically conductive structure is one of a gas injection nozzle, a voltage pin or a nano-manipulator.

17. The non-transitory computer-readable memory set forth in claim 16 wherein the computer-readable instructions cause the electrically conductive structure to be positioned one and a half millimeters or less away from the region.

18. The non-transitory computer-readable memory set forth in claim 16 wherein the electrically conductive structure comprises a gas injection nozzle positioned between a column cap of the FIB column and the sample.

19. The non-transitory computer-readable memory set forth in claim 18 wherein the computer-readable instructions further comprise instructions that cause the one or more processors to heat the gas injection nozzle while a negative bias voltage is applied to the gas injection nozzle.

20. The non-transitory computer-readable memory set forth in claim 18 wherein a first end of the gas injection nozzle is positioned adjacent to the region and a second end of the gas injection nozzle extends through a conductive wall of a component of the vacuum chamber and is electrically isolated from and thermally coupled to the wall.

\* \* \* \* \*